(12) United States Patent
Wang et al.

(10) Patent No.: US 6,368,908 B1
(45) Date of Patent: Apr. 9, 2002

(54) METHOD OF FABRICATING DYNAMIC RANDOM ACCESS MEMORY CAPACITOR

(75) Inventors: Chuan-Fu Wang, Taipei Hsien; J. S. Jason Jenq, Pingtung, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/200,242

(22) Filed: Nov. 25, 1998

(51) Int. Cl.[7] .......................................... H01L 21/8234
(52) U.S. Cl. ....................................... 438/238; 438/396
(58) Field of Search ................................ 438/253, 254, 438/255, 396, 397, 398, 238, 241

(56) References Cited

U.S. PATENT DOCUMENTS 5,491,103 A * 2/1996 Ahn et al. ...................... 437/52
5,903,430 A * 5/1999 Takaishi .................... 361/301.4

* cited by examiner

*Primary Examiner*—David Nelms
*Assistant Examiner*—Quoc Hoang

(57) ABSTRACT

A method of fabricating a capacitor includes formation of a stacked layer formed by alternately forming conductive layers and isolation layers and then patterning these layers to form a stacked layer. An opening is formed above the source/drain region. A conductive spacer is formed on the sidewall of the opening. The conductive spacer is used as a mask. The dielectric layer below the stacked layer exposed by the opening is removed to form a contact hole. The top isolation layer of the stacked layer is removed. A conductive layer is formed over the substrate to fill the contact hole. The conductive spacer is covered by the conductive layer to form a raised region. A stacked spacer is formed beside the raised region. The isolation spacers of the stacked spacer and the isolation layer are removed to expose a storage electrode.

19 Claims, 5 Drawing Sheets

METHOD OF FABRICATING DYNAMIC RANDOM ACCESS MEMORY CAPACITOR

BACKGROUND OF THE INVENTION

1. Field of the Invention

The present invention relates to a semiconductor fabricating method. More particularly, the present invention relates to a method of fabricating a capacitor.

2. Description of the Related Art

As the function of a microprocessor becomes more powerful, the program and software calculations become more complicated, and thus the need for Dynamic Random Access Memory (DRAM) storage memory is increased. As the number of semiconductor devices incorporated in an integrated circuit increases, a memory cell, which comprises a transfer field effect transistor (TFET) and a storage capacitor, is widely used. FIG. 1 is a circuit diagram of a DRAM memory cell. A capacitor C selected from an array of capacitors is used to store information as binary data by charging/discharging the capacitor C. Normally, a binary bit is stored in each capacitor. When the capacitor C is free of charge, logic "0" is represented, whereas when the capacitor is fully charged, logic "1" is represented. In general, a dielectric film 101 is deposited between a top electrode (cell electrode) 102 and a bottom electrode (storage electrode) 100. The capacitor C is electrically coupled with a bit line BL. The read/write operations of a DRAM memory cell are performed by charging/discharging the capacitor C. The bit line BL is connected to the drain of a transfer field effect transistor T. The capacitor C is connected to the source of the transfer field effect transistor T. A signal is transmitted through a gate of the transfer field effect transistor T, which controls the capacitor C by turning on or off the connection with the bit line BL. In other words, the transfer field effect transistor T acts as a switch to control the charging or discharging the capacitor C.

In the DRAM manufacturing process, a two-dimensional capacitor called a planar type capacitor is mainly used for a conventional DRAM having a storage capacity less than 1M (mega=million) bits. In the case of a DRAM having a memory cell using a planar, type capacitor, electric charges are stored on the main surface of a semiconductor substrate, and thus the main surface is required to have a large area. This type of a memory cell is therefore not suited to a DRAM having a high degree of integration. For a highly integrated DRAM, such as a DRAM with more than 4M bits of memory, a three-dimensional capacitor, such as a stacked-type or a trench-type capacitor, has been introduced.

With stacked-type or trench-type capacitors, it has been made possible to obtain a larger memory in a similar Volume. However, to realize a semiconductor device of an even higher degree of integration, such as a very-large-scale integration (VLSI) circuit having, a capacity, of 64M bits, a capacitor of such a simple three-dimensional structure as the conventional stacked-type or trench-type, turns out to be insufficient.

One solution for improving the capacitance of a capacitor is to use a fin-type stacked capacitor. The fin-type stacked capacitor includes electrodes and dielectric layers which extend in a fin shape with a plurality of stacked layers. Hence, when the surface area of the electrode is enlarged, the capacitance is increased. Refer to Ema et al., "3-Dimensional Stacked Capacitor Cell for 16M and 64M DRAMs", International Electron Devices Meeting, pp. 592–595, December 1988, and the U.S. Pat. Nos. 5,071,783, 5,126,810, and 5,206,787.

Another solution for improving the capacitance of a capacitor is to use a cylindrical-type stacked capacitor. The cylindrical-type stacked capacitor includes electrodes and dielectric films which extend in a cylindrical shape to increase the surface areas of the electrodes. Refer to Wakamiya et al., Novel Stacked Capacitor Cell for 64-Mb DRAM. 1989 Symposium on VLSI Technology Digest of Technical Papers, pp. 69–70, and the U.S. Pat. No. 5,077,688.

With the trend toward high integration density, the size of the DRAM cell must be further reduced. Generally, a reduction in the size of the cell leads to a reduction in charge storage capacitance. Additionally, as the capacitance is reduced, the likelihood of soft errors arising from the incidence of α-rays is increased. Therefore, there is still a need in this art to design a new structure and methods for further increasing the capacitance of a storage capacitor, while reducing the area occupied by the capacitor in a plane.

SUMMARY OF THE INVENTION

Accordingly, the invention provides a fabricating method of a capacitor, which maintains the capacitance while decreasing the area occupied by the capacitor in a plane. The other purpose of the invention is to decrease the manufacturing costs, and increase process tolerance and product yield.

According to the invention, the method of fabricating a capacitor comprises the steps of forming a transistor on a substrate and forming a dielectric layer, an etching stop layer, and a stacked layer in sequence over the substrate. Preferably, the material of the etching stop layer includes silicon nitride. The stacked layer is formed from alternately arranged several conductive layers and isolation layers. Preferably, the material of the isolation layers of the stacked layer includes silicon oxide. Preferably, the material of the conductive layers of the stacked layer includes doped polysilicon. The etching stop layer is used as an etching stop point. The stacked layer is patterned to form an opening above the source/drain region of the transistor. A conductive spacer is formed on the sidewall of the stacked layer exposed by the opening. The conductive spacer is used as a mask. A portion of the etching stop layer and the dielectric layer exposed by the opening are removed to form a contact hole, which exposes the source/drain region. In the same step, the top isolation layer of the stacked layer is simultaneously removed to expose the top conductive layer of the stacked layer. A conductive layer is formed over the substrate to fill the contact hole. The conductive layer is electrically coupled with the source/drain region. The conductive spacer is covered by the conductive layer to form a raised region. A stacked spacer is formed beside the raised region. The stacked spacer is stacked by alternately forming several isolation layers and several conductive layers. The conductive layer and the stacked layer are patterned. The isolation spacers of the stacked spacer and the isolation layers of the stacked layer are removed to expose a storage electrode. The storage electrode is formed from the conductive layer and the conductive spacers.

In a further aspect of the invention, the etching rate of the etching stop layer is different from the etching rates of the conductive layer and the first isolation layers of the stacked layer. The etching rate of the isolation layers of the stacked layer is different from the etching rate of the conductive layers of the stacked layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
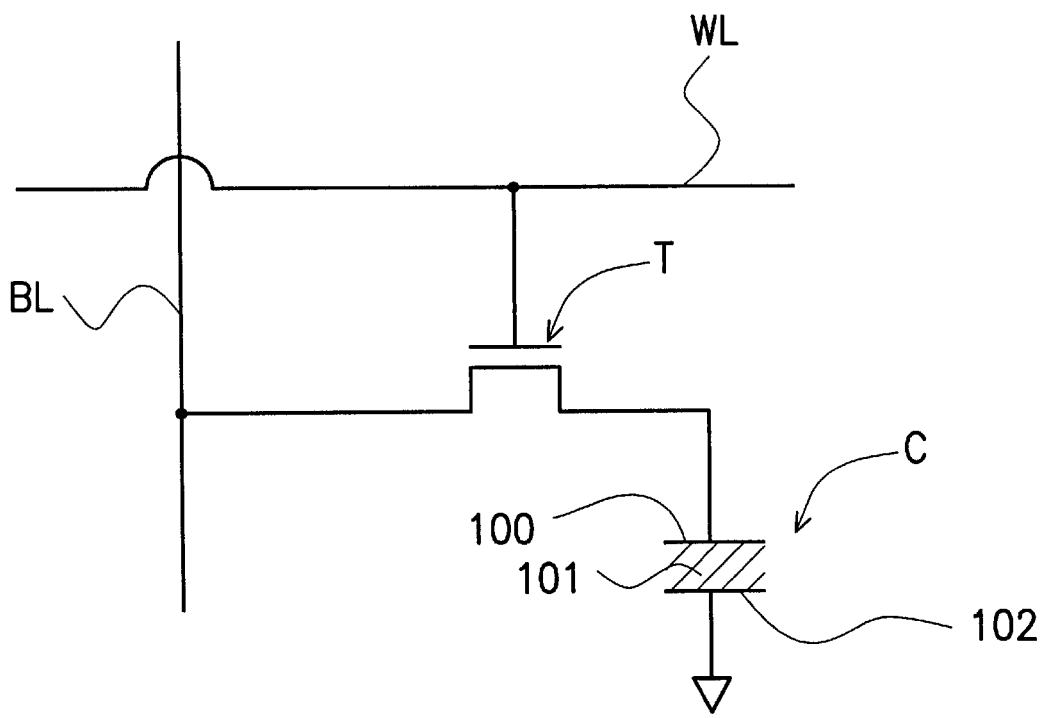
FIG. 1 is a circuit diagram of a dynamic random memory cell (DRAM) memory cell.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are schematic, cross-sectional views showing a DRAM capacitor fabricating process according to one preferred embodiment of the invention.

Figure 2A:
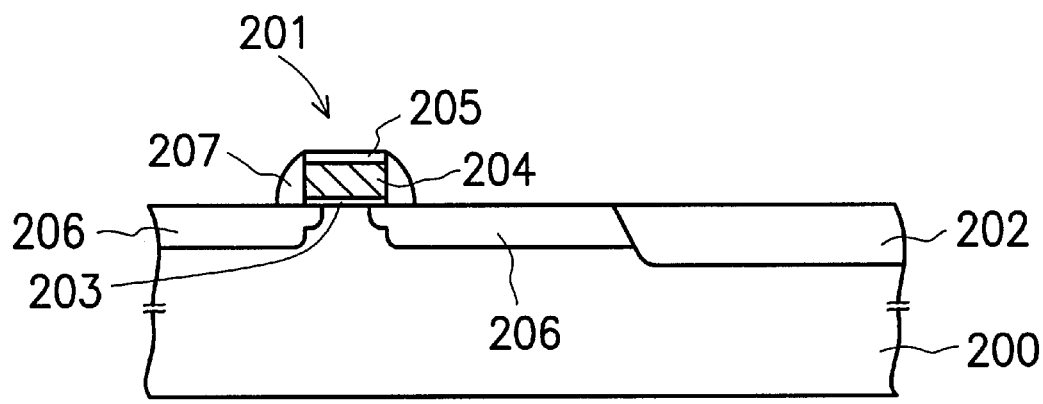
FIGS. 2A through 2H are schematic, cross-sectional views showing a DRAM capacitor fabricating process according to one preferred embodiment of the invention.

In FIG. 2A, a substrate 200 is shown. The substrate 200 can be any suitable semiconductor substrate, for example, a P-type silicon substrate. An isolation structure 202 is formed in the substrate 200. The isolation structure 202 is used to define active regions in the substrate 200. The isolation 202 can be formed by a local oxidation (LOCOS) method or a shallow trench isolation (STI) method, for example. A field effect transistor 201 is formed on an active region of the substrate 200. The method of forming the field effect transistor 201 includes the steps of forming a thin oxide layer (not shown) on the substrate 200 by hot oxidation. A conductive layer (not shown) and an isolation layer (not shown) are formed in sequence on the thin oxide layer. The thin oxide layer, the conductive layer, and the isolation layer are patterned to form a gate oxide layer 203, a gate conductive layer 204, and a gate cap layer 205, which completes construction of the field effect transistor 201. The substrate 200 is doped to form a source/drain region 206 in the substrate 200. An isolation layer (not shown) is formed on the substrate 200. The isolation layer is etched back to form a spacer 207 on the sidewall of the gate oxide layer 203, the conductive gate layer 204, and the gate cap layer 205. The conductive gate layer 204 can be, for example, a doped polysilicon layer formed by chemical vapor deposition. The material of the gate cap layer 205 and the spacer 207 can be, for example, silicon nitride. The gate cap layer 205 and the spacer 207 can be formed by chemical vapor deposition, for example. The gate cap layer 205 and the spacer 207 are not necessarily made of the same material.

Figure 2B:
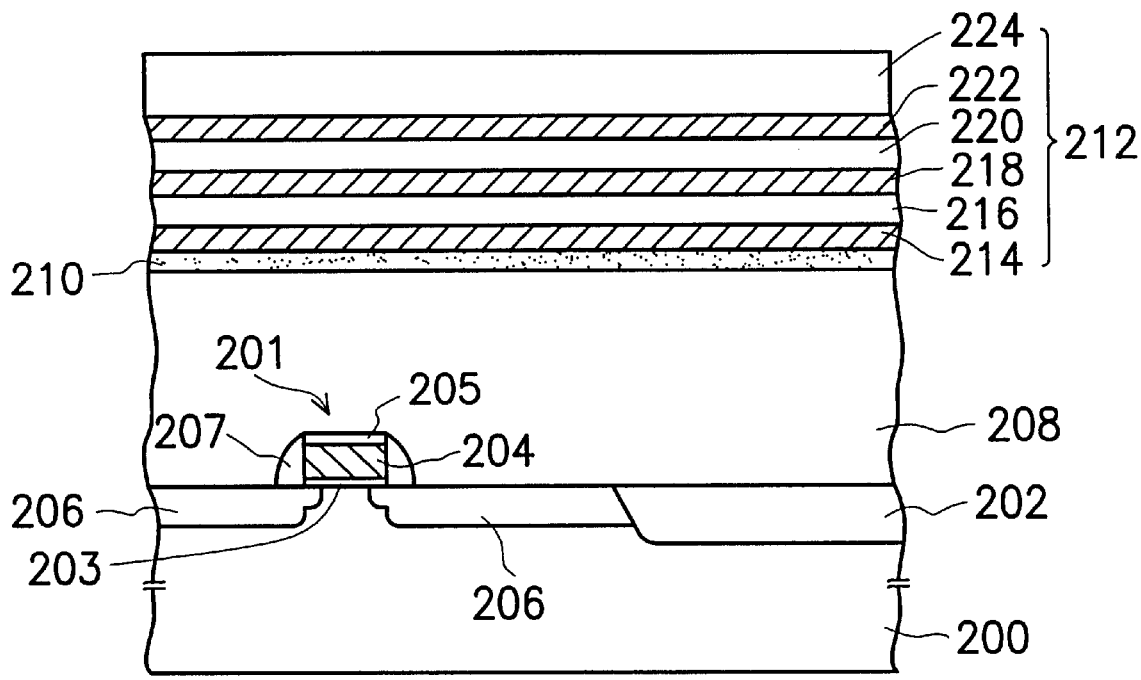

In FIG. 2B, a dielectric layer 208, an etching stop layer 210, and a stacked layer 212 are formed in sequence over the substrate 200. The material of the dielectric layer 208 can be silicon oxide or borophosphosilicate glass (BPSG), for example. Preferably, the steps of forming the dielectric layer 208 includes first forming a silicon oxide layer or a PBSG layer, and then performing a planarization step, such as chemical mechanical polishing step. The stacked layer 212 is formed by alternately depositing layers 214, 218, and 222 and isolation layers 216, 220, and 224. Preferably, the conductive layers 214, 218, and 222 are made of the same material, the isolation layers 216, 220m and 224 are made of the same material. But deferent conductive layers 214, 218, and 222 can be made of different materials or have different compositions. The same is true for isolation layers 216, 220m and 224. The etching rate of the isolation layers 216, 220, and 224 is different from the etching rate of conductive layers 214, 218, and 222. Preferably, the isolation layers 216, 220, and 224 include silicon oxide layers formed by chemical vapor deposition. Preferably, the material of the conductive layers 214, 218, and 222 includes doped polysilicon. The method of forming the conductive layers 214, 218, and 222 includes chemical vapor deposition. The etching rate of the etching stop layer 210 is different from the etching rates of the conductive layers 214, 218, and 222 and the isolation layers 216, 220, and 224 of the stacked layer 212. If the material of the conductive layers 214, 218, and 222 is doped polysilicon, the material of the isolation layers 216, 220, and 224 is silicon oxide, the material of the etching stop layer 210 preferably is silicon nitride or silicon-oxy-nitride, for example.

Figure 2C:
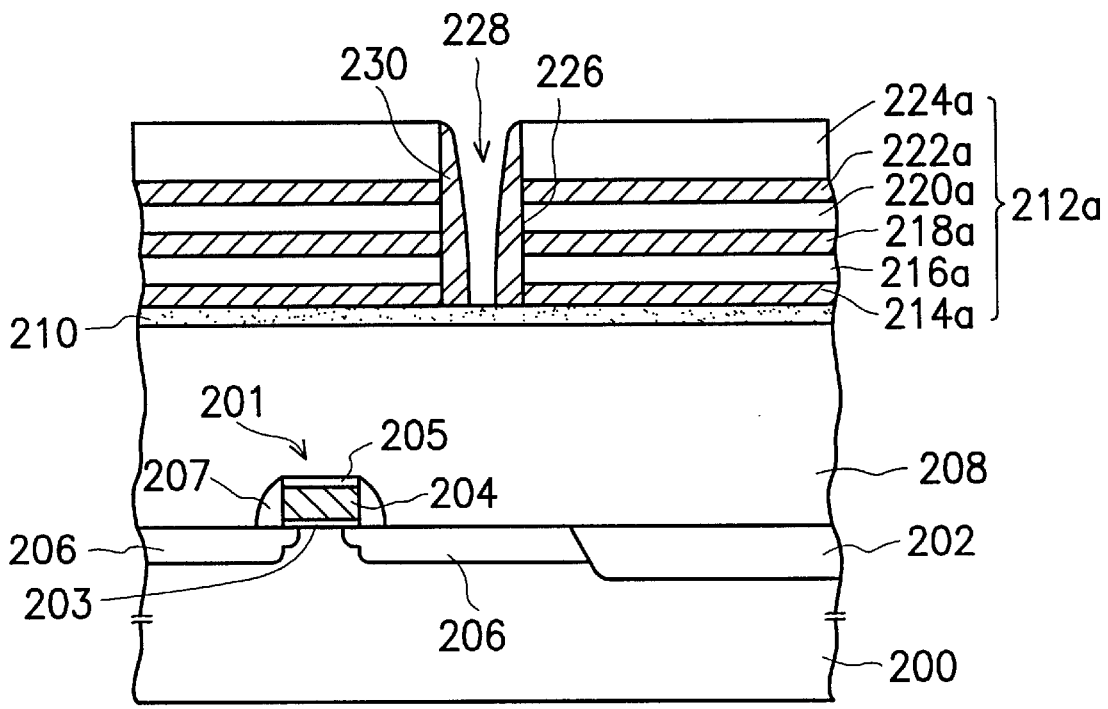

In FIG. 2C, the etching stop layer 210 is used as etching stop point. The stacked layer 212 is patterned to form an opening 228 above the source/drain region 206. A stacked layer 212a composed of conductive layers 214a, 218a, and 222a and isolation layers 216a, 220a, and 224a are remained after patterning. A conductive spacer 230 is formed on a sidewall 226 of the stacked layer exposed by the opening 228. The material of the conductive spacer 230 includes doped polysilicon. Typically, the step of forming the conductive spacer 230 includes forming a conductive layer (not shown) over the substrate 200 by chemical vapor deposition. Anisotropic etching is performed form the conductive spacer 230 on the sidewall of the stacked layer 212a exposed by the opening 228.

Figure 2D:
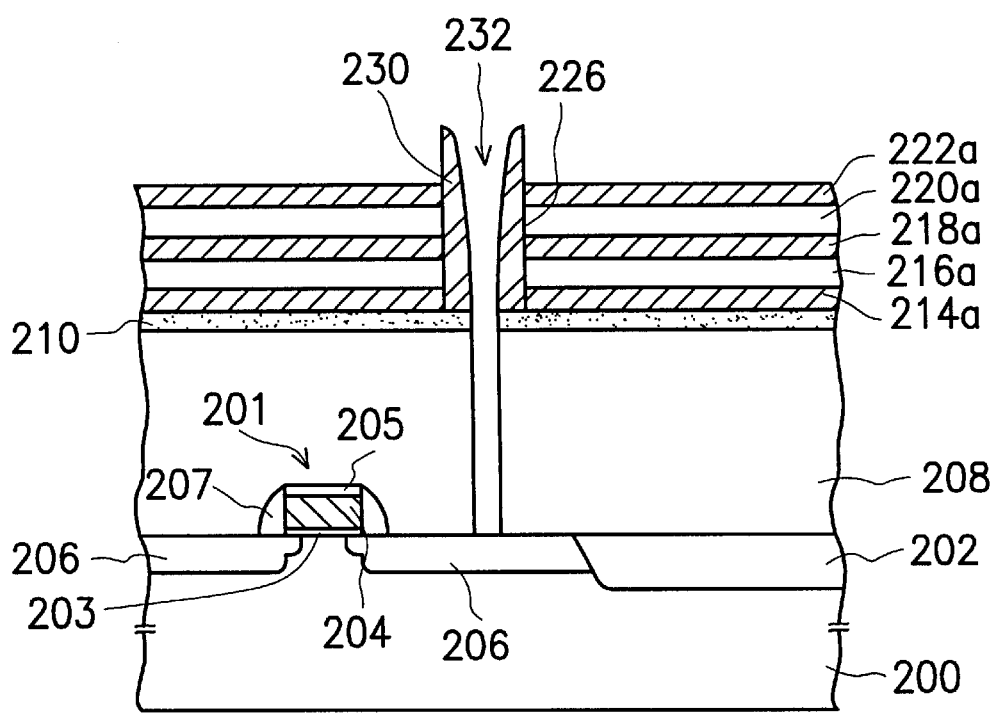

In FIG. 2D, the conductive spacer 230 is used as mask. The isolation layer 224a is removed to expose a portion of the conductive spacer 230 and the conductive layer 222a of the stacked layer 212a. A portion of the dielectric layer 208 exposed by the opening 228 is removed to form a contact hole 232 exposing the source/drain region 206. If the materials of the dielectric layer 208 and the isolation layer 224a of the stacked layer 212a are the same, the dielectric layer 208 and the isolation layer 224a can be removed simultaneously by anisotropic dry etching, for example.

Figure 2E:
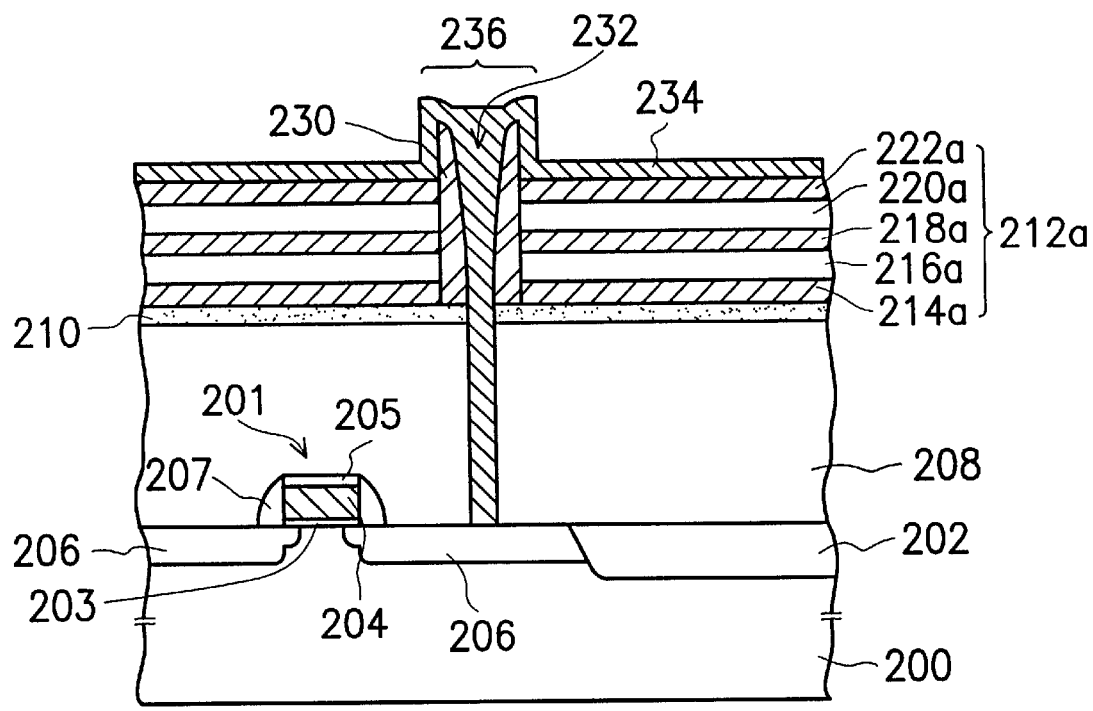

In FIG. 2E, a conductive layer 234 is formed over the substrate 200. The conductive layer 234 fills the contact hole 232 and is electrically coupled with the source/drain region 206. A portion of the conductive spacer 230 rises above the surface of the conductive layer 222a. Thus, a raised region 236 is formed after forming the conductive layer 234 on the conductive spacer 230. The conductive layer can be a doped polysilicon layer formed by chemical vapor deposition.

Figure 2F:
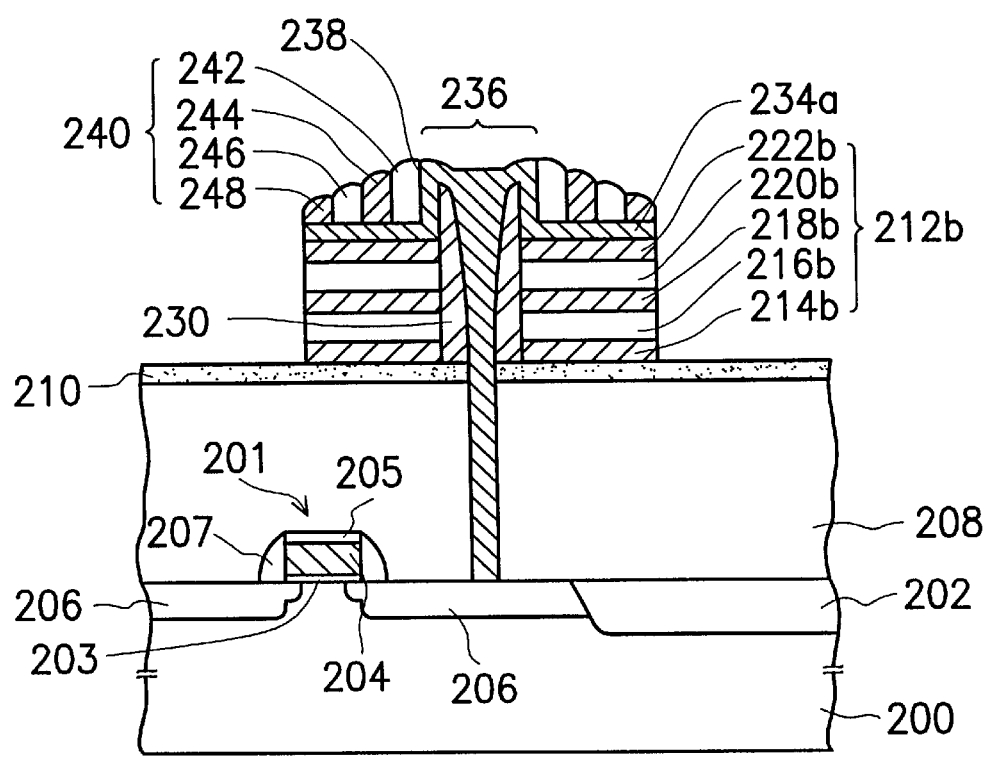

In FIG. 2F, a stacked spacer 240 is formed on a sidewall 238 of the raised region 236, which is formed from the conductive layer 234 and the conductive spacer 230. The etching stop layer 210 is using as an etching stop point when patterning the conductive layer 234 and the stacked layer 212a. A stacked layer 212b composed of conductive layers 214b, 218b, and 222b and isolation layers 216b, 220b and a conductive layer 234a are formed from the remaining portion of the stacked layer 212a after patterning. The stacked spacer 240 is stacked by alternately forming several isolation spacers and conductive spacers, for example, the isolation layers 242, 246 and the conductive spacers 244, 248. The steps to form the conductive spacers 244, 248 include forming a doped polysilicon layer over the substrate 200 by chemical vapor deposition and then performing anisotropic etching to form the conductive spacers 244, 248. The etching rate of the isolation spacers 242, 246 is different from the conductive spacers 244, 248. The material of the conductive spacers 242, 246 includes silicon oxide. The method of forming the conductive spacers 242, 246 includes forming a silicon oxide over the substrate 200 by chemical vapor deposition and then performing anisotropic etching.

Figure 2G:
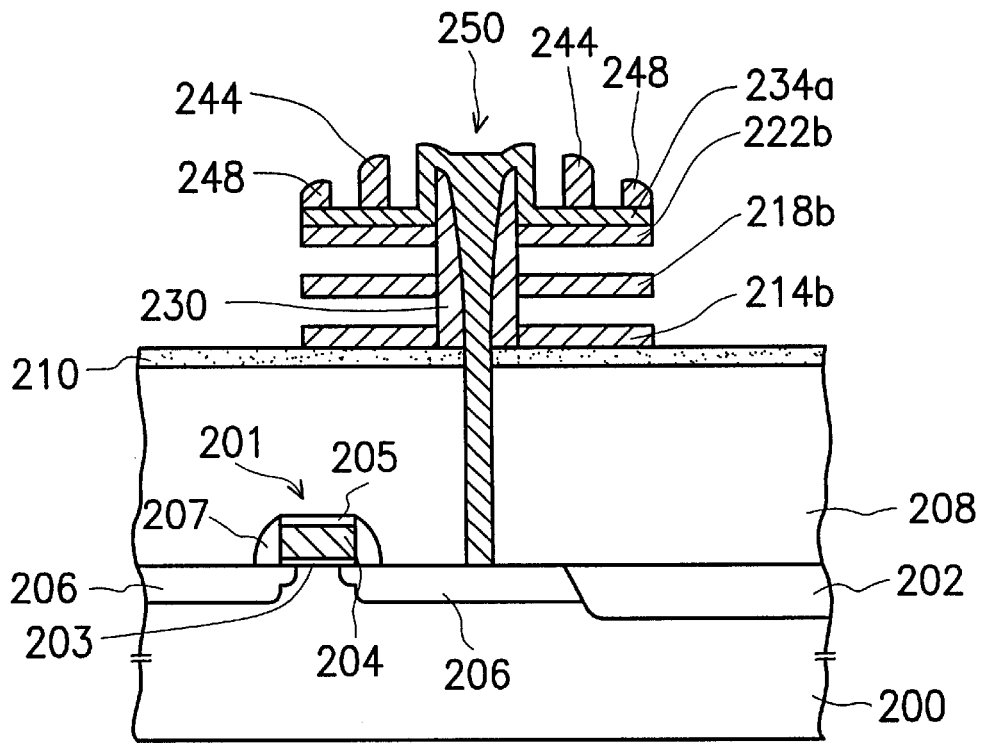

In FIG. 2G, the stacked layer 212b, the isolation layers 216b, and 220b, and the isolation spacers 242, and 246 of the stacked spacer 240 are removed to expose the storage electrode 250. The storage electrode 250 is formed from the conductive layers 214b, 218b, and 222b remaining from the stacked layer 212b (FIG. 2F) and the conductive spacer 230, the conductive layer 234a, and the conductive spacers 244, 248 remaining from the stacked spacer 240 (FIG. 2F). For example, the isolation layers 216b, 220b of the stacked layer 212b and the isolation spacers 242, 246 of the stacked spacer 240 are removed by wet etching. For example, if the material of the isolation layers 216b, and 220b and the isolation spacers 242, and 246 is silicon oxide, then the isolation layers 216b, 220b and the isolation spacers 242, 246 can be removed by using HF as an etching solution and then performing anisotropic etching to expose the storage electrode 250.

Figure 2H:
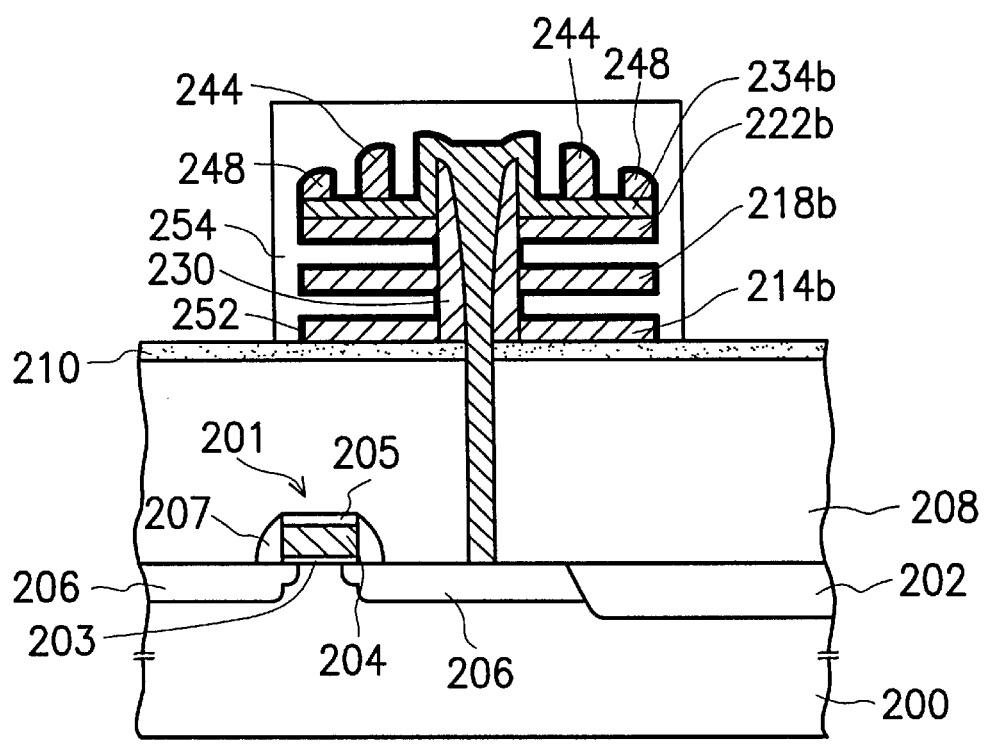

In FIG. 2H, a dielectric film 252 and a conductive layer 254 are formed in sequence over the substrate 200 and the storage electrode 250. The conductive layer 254 is used as a cell electrode. A capacitor is completed. The dielectric film layer 252 can be, for example, a silicon oxide layer, a silicon nitride/silicon oxide (NO) layer, a silicon oxide/silicon nitride/silicon oxide (ONO) layer, a Ta$_2$O$_5$ layer, a Pb(Zr, Ti)O$_3$ layer (PZT layer), a (Ba, Sr)TiO$_3$ layer (BST layer), or other suitable layers with high dielectric constant. The conductive layer 254 can be, for example, a doped polysilicon layer formed by simultaneous chemical vapor deposition and doping N-type As ions.

In summary, the present invention is characterized by the formation of a storage electrode in a tree shape. The effective area of the storage electrode is enlarged in a limited area occupied in a plane. The storage ability of the DRAM capacitor is increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor, comprising the steps of:

providing a substrate with a transistor having a source/drain region on the substrate;

forming a dielectric layer over the substrate;

forming an etching stop layer over the substrate;

forming a stacked layer on the etching stop layer, wherein the stacked layer is formed by alternately forming at least a first conductive layer, a first isolation layer, a second conductive layer, and a second isolation layer in sequence;

using the etching stop layer as etching stop point and patterning the stacked layer to form an opening above the source/drain region exposing the etching stop layer;

forming a first conductive spacer on the sidewall of the stacked layer exposed by the opening;

using the first conductive spacer as a mask to remove a portion of the etching stop layer and the dielectric layer exposed by the opening to form a contact hole exposing the source/drain region;

removing the second isolation layer;

forming a third conductive layer over the substrate and the first conductive spacer forming a raised region, wherein the third conductive layer fills the contact hole and is electrically coupled with the source/drain region;

forming a stacked spacer on a sidewall of the raised regions, wherein the stacked spacer is formed by at least forming a first isolation spacer and a second conductive spacer in sequence;

pattern the third conductive layer and the stacked layer;

removing the first isolation spacer and the first isolation layer to form a storage electrode defined by the first conductive layer, the second conductive layer, the third conductive layer, the first conductive spacer, and the second conductive spacer; and forming a dielectric film and a fourth conductive layer in sequence over the storage electrode.

2. The method of claim 1, wherein the etching rate of the etching stop layer is different from the etching rates of the first conductive layer, the second conductive layer, the first isolation layer, and the isolation layer.

3. The method of claim 2, wherein the material of the etching stop layer comprises silicon nitride.

4. The method of claim 1, wherein the etching rate of the first isolation layer and the second isolation layer is different from the etching rate of the first conductive layer and the second conductive layer.

5. The method of claim 4, wherein the material of the first isolation layer and the second isolation layer comprises silicon oxide.

6. The method of claim 4, wherein the material of the first conductive layer and the second conductive layer comprises doped polysilicon.

7. The method of claim 1, wherein the step of forming the first conductive spacer comprises:

forming a fifth conductive layer over the substrate; and performing anisotropic etching and removing a portion of the fifth conductive layer to form the first conductive spacer.

8. The method of claim 1, wherein the material of the fifth conductive layer comprises doped polysilicon.

9. The method of claim 1, wherein the step of removing a portion of the dielectric layer and the second isolation layer comprises isotropic etching.

10. The method of claim 1, wherein material of the third conductive layer comprises doped polysilicon.

11. The method of claim 1, wherein the etching rates of the first isolation spacer and the second conductive spacer are different.

12. The method of claim 1, wherein the step of forming the first isolation spacer comprises:

forming a third isolation layer over the substrate; and performing anisotropic etching and removing a portion of the third isolation layer to form the first isolation spacer.

13. The method of claim 11, wherein the step of forming the second conductive layer comprises:

forming a sixth conductive layer over the substrate; and performing anisotropic etching and removing a portion of the sixth conductive layer to form the second conductive spacer.

14. The method of claim 13, wherein the material of the sixth conductive layer comprises doped polysilicon.

15. The method of claim 1, wherein the step of forming the first isolation spacer and the first isolation layer comprises isotropic etching.

16. The method of claim 1, wherein the dielectric film comprises a silicon nitride/silicon oxide (NO) layer.

17. The method of claim 1, wherein the dielectric film comprises a silicon oxide/silicon nitride/silicon oxide layer.

18. The method of claim 1, wherein the dielectric film comprises a $Ta_2O_5$ layer.

19. The method of claim 1, wherein the material of the fourth conductive layer comprises doped polysilicon.

* * * * *